(12) United States Patent
Lin et al.

(10) Patent No.: US 8,218,369 B2
(45) Date of Patent: Jul. 10, 2012

(54) NON-VOLATILE MEMORY LOW VOLTAGE AND HIGH SPEED ERASURE METHOD

(75) Inventors: Hsin Chang Lin, Hsin-Chu County (TW); Wen-Chien Huang, Hsin-Chu County (TW)

(73) Assignee: Yield Microelectronics Corp., Hsin-Chu County (TW)

( * ) Notice: Subject to any disclaimer, the term of this patent is extended or adjusted under 35 U.S.C. 154(b) by 348 days.

(21) Appl. No.: 12/692,868

(22) Filed: Jan. 25, 2010

(65) Prior Publication Data
US 2011/0182124 A1 Jul. 28, 2011

(51) Int. Cl.
*G11C 16/02* (2006.01)
(52) U.S. Cl. .......... 365/185.29; 365/185.18; 365/185.27
(58) Field of Classification Search .................. None
See application file for complete search history.

(56) References Cited

U.S. PATENT DOCUMENTS

| | | | | |
|---|---|---|---|---|
| 4,884,239 A * | 11/1989 | Ono et al. | ................ | 365/185.27 |
| 5,349,220 A * | 9/1994 | Hong | ....................... | 365/185.27 |
| 6,876,582 B2 * | 4/2005 | Wang et al. | ............... | 365/185.29 |

* cited by examiner

*Primary Examiner* — Tan T. Nguyen
(74) *Attorney, Agent, or Firm* — Rosenberg, Klein & Lee

(57) ABSTRACT

A non-volatile memory low voltage and high speed erasure method, the non-volatile memory is realized through disposing a stacked gate structure having a control gate and a floating gate on a semiconductor substrate or in an isolation well, such that adequate hot holes are generated in proceeding with low voltage and high speed erasure operation through a drain reverse bias and making changes to gate voltage. In addition, through applying positive and negative voltages on a drain, a gate, and a semiconductor substrate or well regions, adequate hot holes are generated, so as to lower the absolute voltage in achieving the objective of reducing voltage of erasing memory.

4 Claims, 4 Drawing Sheets

NON-VOLATILE MEMORY LOW VOLTAGE AND HIGH SPEED ERASURE METHOD

BACKGROUND OF THE INVENTION

1. Field of the Invention

The present invention relates to a non-volatile memory low voltage and high speed erasure method, and in particular to a non-volatile memory low voltage and high speed erasure method, that can be used to generate adequate hot holes to proceed with low voltage and high speed erasure operations by means of reverse bias and changed gate voltage.

2. The Prior Arts

Presently, Complementary Metal Oxide Semiconductor (CMOS) technology is frequently utilized in producing Application Specific Integrated Circuit (ASIC), and in the present age of Computer & Information technologies, the Electrically Erasable Programmable Read Only Memory (EEPROM) is widely utilized in various electronic products for its non-volatile memory capability of being electrically programmable and erasable, and also data stored therein will not disappear after power is shut down.

In general, the non-volatile memory is programmable, that can be used to store charges for changing the gate voltage of the transistor of the memory, or not to store charges for retaining the original gate voltage of the transistor of the memory. The purpose and functions of an erasure operation is to remove all the charges stored in the non-volatile memory, so that all the non-volatile memory will return to the original gate voltage of the transistor of the memory. In a structure of non-volatile memory of the prior art, usually, the erasure voltage utilized is in the excess of 10V, and the time required for erasure is in the order of milli-second (ms), such that not only the voltage raising area could cause the increase of cost, but it also can not achieve the purpose of low voltage and high speed erasure. Besides, in the advanced technology of producing erasable non-volatile memory, in order to reduce the influence of an oxide layer to the erasure voltage and time, a tunneling oxide layer has to be added, such that it would not only result in difficulties in manufacturing, but it could also increase production cost.

SUMMARY OF THE INVENTION

In view of the problems and shortcomings of the prior art, a major objective of the present invention is to provide a non-volatile memory low voltage and high speed erasure method, that is used to create adequate hot holes to proceed with erasure through raising the drain voltage and changing the gate voltage, so as to realize the objectives of low voltage and high speed erasure.

Another objective of the present invention is to provide a non-volatile memory low voltage and high speed erasure method, wherein, positive and negative voltages are utilized to achieve an ultra-low operation voltage, a low operation current, and high reliability, so that the size of the entire non-volatile memory can be miniaturized.

Therefore, in order to achieve the above-mentioned objectives, the present invention provides a non-volatile memory low voltage and high speed erasure method, that is applicable to the non-volatile memory. Such a non-volatile memory is realized through forming a stacked gate structure in a substrate made of semiconductor. The stacked gate structure includes a floating gate and a control gate separated by a gate dielectric layer, and is stacked on the surface of a tunneling dielectric layer. The tunneling dielectric layer is located on a semiconductor substrate or in an isolation well, such that its source and drain are on the two sides of a stacked gate structure. Wherein, the semiconductor substrate or the isolation well are P type, the source and the drain are N type; or, alternatively, the semiconductor substrate or the isolation well is N type, the source and the drain are P type.

The non-volatile memory low voltage and high speed erasure method comprises the following steps: changing the gate voltage while erasing the memory, such that drain voltage is greater than source voltage, so as to generate adequate hot holes in achieving high speed erasure of memory; or utilizing a negative voltage device in achieving an ultra low operation voltage and a low operation current. Through the application of the present invention, the memory erasure speed can be increased 10-100 folds, while achieving reduced erasure voltages. As such, all the applications utilizing the method of the present invention in implementing erasure of the non-volatile memory of various different structures can be considered falling into the scope of the present invention.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

BRIEF DESCRIPTION OF THE DRAWINGS

The related drawings in connection with the detailed description of the present invention to be made later are described briefly as follows, in which.

DETAILED DESCRIPTION OF THE PREFERRED EMBODIMENT

The purpose, construction, features, functions and advantages of the present invention can be appreciated and understood more thoroughly through the following detailed description with reference to the attached drawings.

Figure 1:
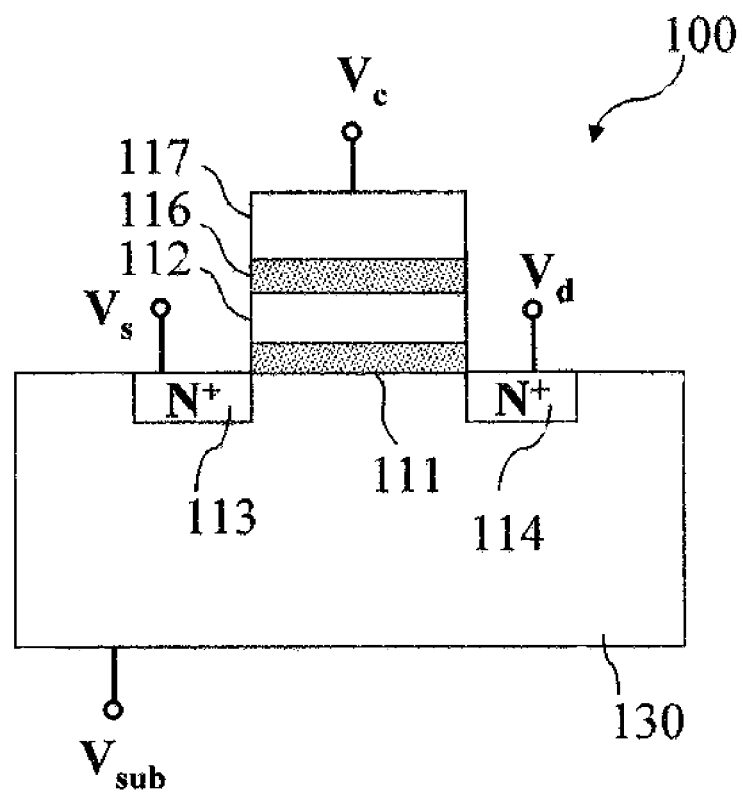
FIG. 1 is a cross section view of a non-volatile memory structure according to a first embodiment of the present invention.

Refer to FIG. 1 for a cross section view of a non-volatile memory structure according to a first embodiment of the present invention. As shown in FIG. 1, the non-volatile memory structure 100 includes: a stacked gate structure disposed in a P-type semiconductor substrate 130. The stacked gate structure includes: a floating gate 112 stacked on a tunneling dielectric layer 111, a control gate 117 disposed above the floating gate 112 through a gate dielectric layer 116, and a source 113 and a drain 114 disposed in a P-type semiconductor substrate 130. Wherein, the source 113 and the drain 114 are N-type ion-doped regions.

Figure 2:
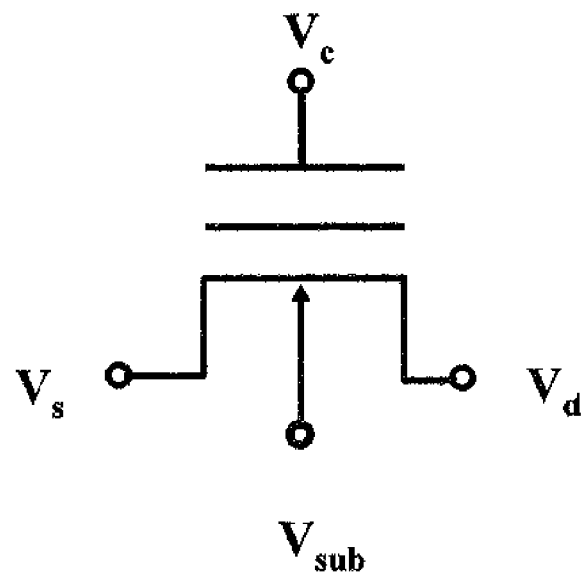
FIG. 2 is an equivalent circuit diagram of a non-volatile memory structure of FIG. 1 according to a first embodiment of the present invention.

As shown in FIG. 1, the non-volatile memory structure 100 is a structure having four terminals: a source, a drain, a controlling gate, and a substrate connection structure respectively, such that a substrate voltage $V_{sub}$, a source voltage $V_s$, a drain voltage $V_d$, and a control gate voltage $V_c$ are applied on the substrate 130, the source 113, the drain 114, and the control gate 117 respectively. In addition, FIG. 2 is an equivalent circuit diagram of a non-volatile memory structure of FIG. 1 according to a first embodiment of the present invention, such that the operation conditions of the low voltage and high speed erasure process of the non-volatile memory structure 100 are as follows:

a. $V_{sub}$ is a ground voltage (=0);
 b. $V_d$>5V, $V_s$ is close to or equal to 0; and
 c. $V_d$>$V_c$≧0, $V_c$ decrementing with erasure time.

In the operation processes from writing to erasing of the non-volatile memory structure 100, through raising the drain voltage, such that when driving the memory structure, due to the influence of Drain-Induced Barrier Lowering effect (DIBL) as incurred by drain voltage, and that the elements are in a saturation mode, therefore, drain voltage $V_d$ is greater than saturation voltage $V_{dsat}$ of the elements, $(V_c-V_s)$>$V_{ths}$, and the saturated threshold voltage $V_{ths}$ is less than the maximum threshold voltage $V_{thmax}$. Then, the hot hole energy gain of the potential difference $V_d-V_{dsat}$ would cause the Drain-Avalanche-Hot-Hole Injection (DAHHI) to the floating gate. Subsequently, the electrons stored in the floating gate are decreased, such that the threshold voltage $V_{th}$ is reduced, and the source-drain current is increased. Finally, gradually lowering the control gate voltage $V_c$, thus reducing the source-drain current, while keeping the erasure speed; or, alternatively, when the non-volatile memory structure 100 satisfies the following conditions, the low voltage and high speed erasure can be achieved:

a. $V_{sub}$ is a negative voltage;
 b. $V_s$ is close to or equal to $V_{sub}$; and
 c. $V_d$>$V_c$, $V_c$ decrementing with erasure time.

Figure 3:
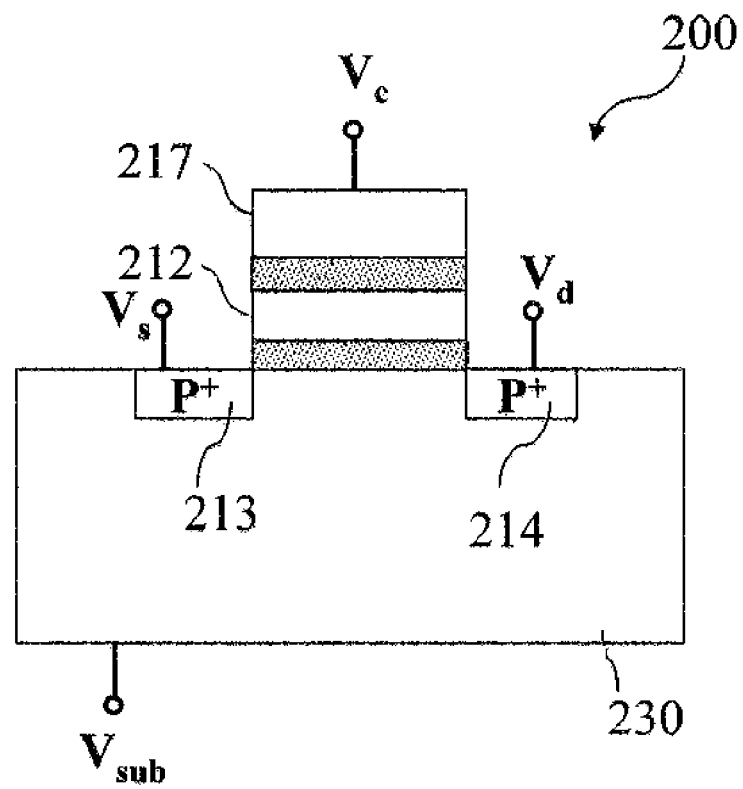
FIG. 3 is a cross section view of a non-volatile memory structure according to a second embodiment of the present invention.

FIG. 3 is a cross section view of a non-volatile memory structure according to a second embodiment of the present invention. As shown in FIG. 3, the non-volatile memory structure 200 of the present invention can be realized through forming a stacked gate structure in an N-type semiconductor substrate 230, such that the source 213 and the drain 214 are P-type ion-doped regions, and the stacked gate structure includes a control gate 217 stacked above a floating gate 212.

Figure 4:
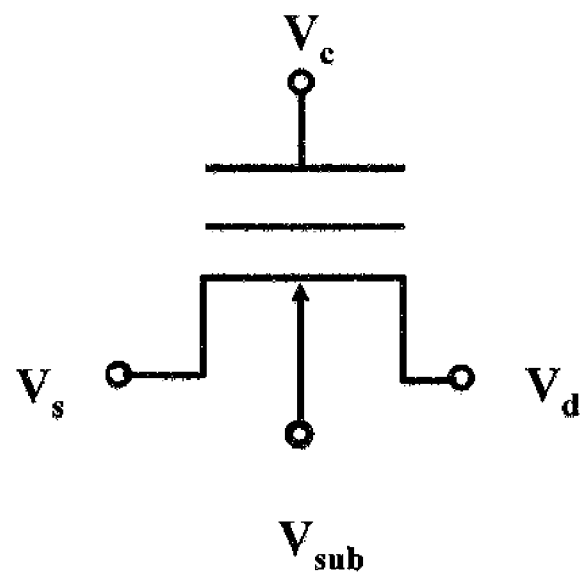
FIG. 4 is an equivalent circuit diagram of a non-volatile memory structure of FIG. 3 according to a second embodiment of the present invention.

In performing low voltage and high speed erasure process to the non-volatile memory structure 200, the erasure is achieved through applying substrate voltage $V_{sub}$, source voltage $V_s$, drain voltage $V_d$, and control gate voltage $V_c$ on the substrate 230, the source 213, drain 214, and the control gate 217 respectively. FIG. 4 is an equivalent circuit diagram of a non-volatile memory structure of FIG. 3 according to a second embodiment of the present invention, such that the operation conditions of the low voltage and high speed erasure process of the non-volatile memory structure 200 are as follows:

a. $V_{sub}$ and $V_s$>5V;
 b. $V_d$ is close to or equal to 0; and
 c. $V_c$>$V_d$, $V_c$ incrementing with erasure time.

In the operation processes from writing to erasing of the non-volatile memory structure 200; through raising the difference of the source and drain voltages, such that when driving the memory structure, due to the influence of Drain-Induced Barrier Lowering Effect (DIBL) as caused by drain voltage, and that the elements are in a saturation mode, therefore, the difference $V_{ds}$ of drain and source voltages is greater than saturation voltage $V_{dsat}$ of the elements, and $|V_c-V_s|$>$|V_{ths}|$, namely, the absolute value of the saturated threshold voltage $V_{ths}$ is less than the maximum threshold voltage $V_{thmax}$. Then, the hot electron energy gain of the potential difference $V_d-V_{dsat}$ would result in the Drain-Avalanche-Hot-Electron Injection (DAHEI) to the floating gate. Subsequently, the holes stored in the floating gate are decreased, such that the threshold voltage $V_{th}$ is raised, and the source-drain current is increased. Finally, gradually increasing the control gate voltage $V_c$, thus reducing the source-drain current, while keeping the erasure speed.

Figure 5:
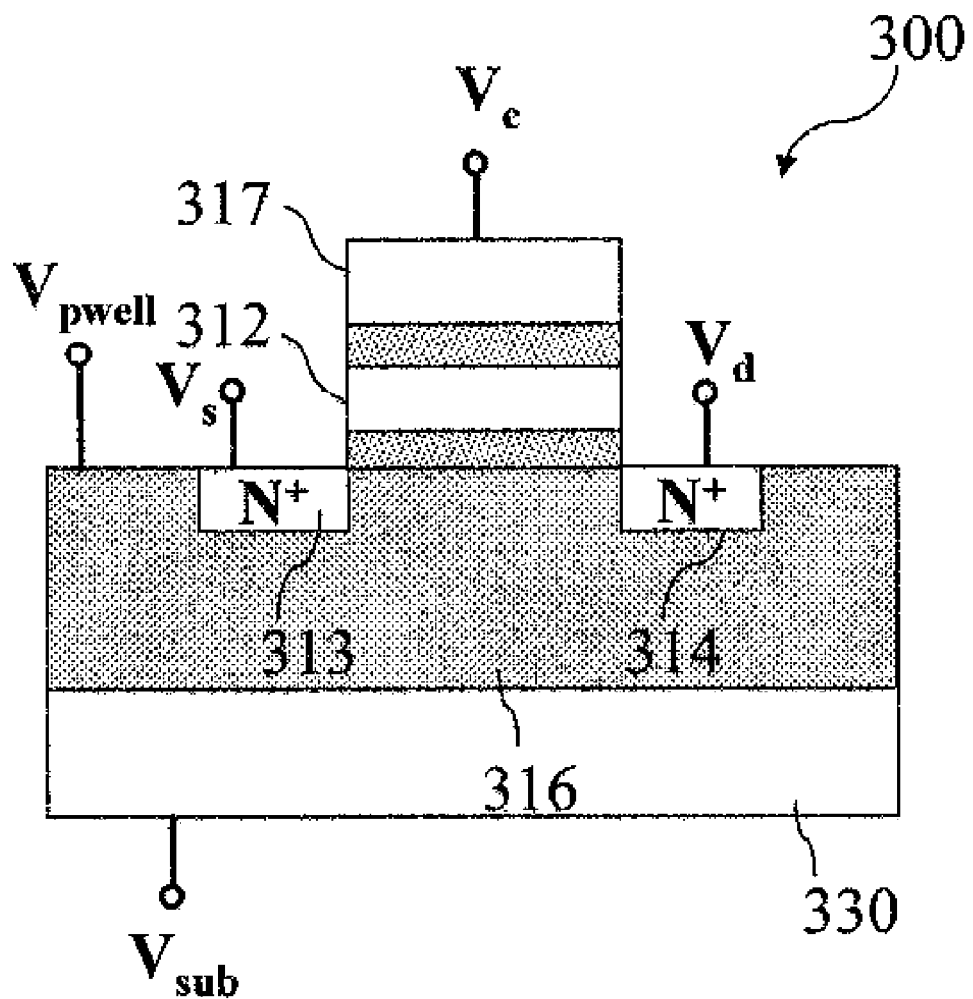
FIG. 5 is a cross section view of a non-volatile memory structure according to a third embodiment of the present invention.

FIG. 5 is a cross section view of a non-volatile memory structure according to a third embodiment of the present invention. As shown in FIG. 5, the non-volatile memory structure 300 of the present invention can be realized through forming a stacked gate structure in an N-type semiconductor substrate 330, such that the source 313 and the drain 314 are P-type ion-doped regions, a P-type well is provided underneath the source 313 and the drain 314, and the stacked gate structure includes a control gate 317 stacked above a floating gate 312.

In performing low voltage and high speed erasure process to the non-volatile memory structure 300, the erasure is achieved through applying substrate voltage $V_{sub}$, P-type well voltage $V_{pwell}$, source voltage $V_s$, drain voltage $V_d$, and control gate voltage $V_c$ on the substrate 330, the P-type well 316, the source 313, the drain 314, and the control gate 317 respectively, such that the operation conditions of the low voltage and high speed erasure process of the non-volatile memory structure 300 are as follows:

a. $V_{pwell}$ is a ground voltage (=0);
 b. $V_d$>5V, Vs is close to or equal to 0; and
 c. $V_d$>$V_c$≧0, $V_c$ decrementing with erasure time.

Or, alternatively, when the non-volatile memory structure 300 satisfies the following conditions, the low voltage and high speed erasure can be achieved:

a. $V_{pwell}$ is a negative voltage;
 b. $V_s$ is close to or equal to $V_{pwell}$; and
 c. $V_d$>$V_c$, $V_c$ decrementing with erasure time.

Figure 6:
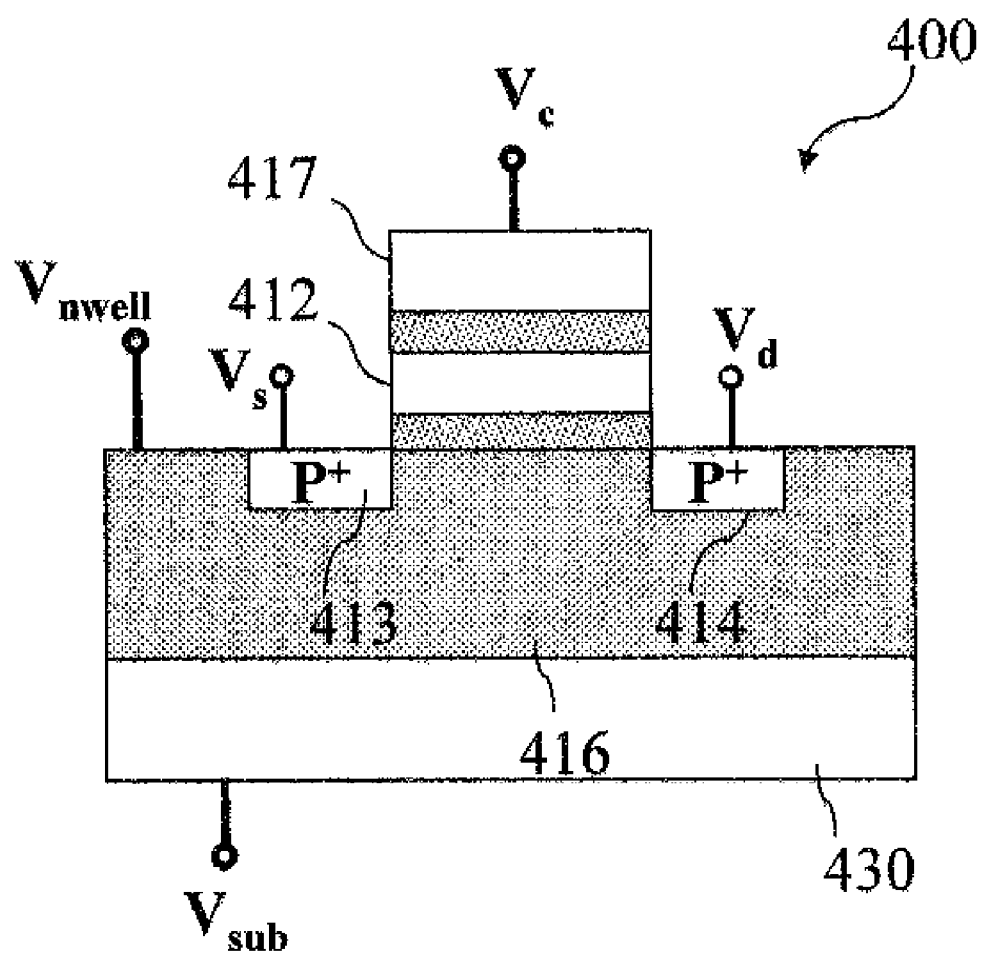
FIG. 6 is a cross section view of a non-volatile memory structure according to a fourth embodiment of the present invention.

FIG. 6 is a cross section view of a non-volatile memory structure according to a fourth embodiment of the present invention. As shown in FIG. 6, the non-volatile memory structure 400 of the present invention can be realized through forming a stacked gate structure in a P-type semiconductor substrate 430, such that source 413 and drain 414 are an N-type ion-doped region, the source 413 and the drain 414 further includes an N-type well 416, and the stacked gate structure includes a control gate 417 stacked above a floating gate 412.

In performing low voltage and high speed erasure process to the non-volatile memory structure 400, the erasure is achieved through applying substrate voltage $V_{sub}$, N-type well voltage $V_{nwell}$, source voltage $V_s$, drain voltage $V_d$, and control gate voltage $V_c$ on the substrate 430, the N-type well 416, the source 413, the drain 414, and the control gate 417 respectively. As such, the operation conditions of the low voltage and high speed erasure process of the non-volatile memory structure 400 are as follows:

a. $V_{nwell}$, and $V_s$>5V;
 b. $V_{nwell}$≧$V_s$;
 c. $V_d$ is close to or equal to 0; and
 d. $V_{nwell}$≧$V_c$>$V_d$, $V_c$ incrementing with erasure time.

Through the application of the non-volatile memory low voltage and high speed erasure method of the present invention, adequate hot holes are created to proceed with low voltage and high speed erasures through raising the difference of the source and drain voltages and making changes to the gate voltage, so as to realize the objectives of low voltage and high speed erasure. In addition, positive and negative voltages are applied on drain, gate, semiconductor substrate or well regions for generating adequate hot holes in reducing the absolute voltage, hereby achieving the purpose of reducing voltage. As such, through the application of the present invention, the erasure speed of the non-volatile memory can be increased 10 to 100 folds, while reducing the erasure voltage required.

The above detailed description of the preferred embodiment is intended to describe more clearly the characteristics and spirit of the present invention. However, the preferred embodiments disclosed above are not intended to be any restrictions to the scope of the present invention. Conversely, its purpose is to include the various changes and equivalent arrangements which are within the scope of the appended claims.

What is claimed is:

1. A non-volatile memory low voltage and high speed erasure method, said non-volatile memory comprising: a stacked gate structure disposed on a P-type semiconductor substrate, a source and a drain disposed on two sides of said stacked gate structure and in said P-type semiconductor substrate, said stacked gate structure includes at least a floating gate and a control gate disposed above said floating gate, said non-volatile memory erasure method includes following steps of:

applying a substrate voltage $V_{sub}$, a source voltage $V_s$, a drain voltage $V_d$, and a control gate voltage $V_c$ on said P-type semiconductor substrate, said source, said drain, and said control gate, when $V_{sub}$ is a ground voltage (=0), while satisfying following conditions:
 a. $V_d > 5V$, $V_s$ is close to or equal to 0; and
 b. $V_d > V_c \geq 0$, $V_c$ decrementing with erasure time; and
when $V_{sub}$ is a negative voltage, while satisfying following conditions:
 a. $V_s$ is close to or equal to $V_{sub}$; and
 b. $V_d > V_c$, $V_c$ decrementing with erasure time.

2. A non-volatile memory low voltage and high speed erasure method, said non-volatile memory comprising: a P-type well disposed in an N-type semiconductor substrate, a stacked gate structure disposed on said P-type well, a source and a drain disposed on two sides of said stacked gate structure and in said P-type well, said stacked gate structure includes at least a floating gate and a control gate disposed above said floating gate, said non-volatile memory erasure method includes following steps of:

applying a substrate voltage $V_{sub}$, a P-type well voltage $V_{pwell}$, a source voltage $V_s$, a drain voltage $V_d$, and a control gate voltage $V_c$ on said N-type semiconductor substrate, said P-type well, said source, said drain, and said control gate, when $V_{pwell}$ is a ground voltage (=0), while satisfying following conditions:
 a. $V_d > 5V$, $V_s$ is close to or equal to 0; and
 b. $V_d > V_c \geq 0$, $V_c$ decrementing with erasure time; and
when $V_{pwell}$ is a negative voltage, while satisfying following conditions:
 a. $V_s$ is close to or equal to $V_{pwell}$; and
 b. $V_d > V_c$, $V_c$ decrementing with erasure time.

3. A non-volatile memory low voltage and high speed erasure method, said non-volatile memory comprising: a stacked gate structure disposed on an N-type semiconductor substrate, a source and a drain disposed on two sides of said stacked gate structure and in said N-type semiconductor substrate, said stacked gate structure includes at least a floating gate and a control gate disposed above said floating gate, said non-volatile memory erasure method includes following steps of:

applying a substrate voltage $V_{sub}$, a source voltage $V_s$, a drain voltage $V_d$, and a control gate voltage $V_c$ on said N-type semiconductor substrate, said source, said drain, and said control gate, while satisfying following conditions:
 a. $V_{sub}$ and $V_s > 5V$;
 b. $V_d$ is close to or equal to 0; and
 c. $V_c > V_d$, $V_c$ incrementing with erasure time.

4. A non-volatile memory low voltage and high speed erasure method, said non-volatile memory comprising: an N-type well disposed in a P-type semiconductor substrate, a stacked gate structure disposed on said N-type well, a source and a drain disposed on two sides of said stacked gate structure and in said N-type well, said stacked gate structure includes at least a floating gate and a control gate disposed above said floating gate, said non-volatile memory erasure method includes following steps of:

applying a substrate voltage $V_{sub}$, an N-type well voltage $V_{nwell}$, a source voltage $V_s$, a drain voltage $V_d$, and a control gate voltage $V_c$ on said P-type semiconductor substrate, said N-type well, said source, said drain, and said control gate, while satisfying following conditions:
 a. $V_{nwell}$, and $V_s > 5V$;
 b. $V_{nwell} \geq V_s$;
 c. $V_d$ is close to or equal to 0; and
 d. $V_{nwell} \geq V_c > V_d$, $V_c$ incrementing with erasure time.

* * * * *